(12) United States Patent
Kurokawa et al.

(10) Patent No.: US 10,121,862 B2
(45) Date of Patent: Nov. 6, 2018

(54) SWITCHING DEVICE AND METHOD OF MANUFACTURING THE SAME

(71) Applicants: TOYOTA JIDOSHA KABUSHIKI KAISHA, Toyota-shi (JP); DENSO CORPORATION, Kariya (JP)

(72) Inventors: Yuto Kurokawa, Nagakute (JP); Yusuke Yamashita, Nagakute (JP); Yasushi Urakami, Kariya (JP)

(73) Assignees: TOYOTA JIDOSHA KABUSHIKI KAISHA, Toyota-shi (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 15/662,829

(22) Filed: Jul. 28, 2017

(65) Prior Publication Data

US 2018/0076289 A1    Mar. 15, 2018

(30) Foreign Application Priority Data

Sep. 15, 2016 (JP) .................................. 2016-180714

(51) Int. Cl.
*H01L 29/10* (2006.01)
*H01L 29/06* (2006.01)
(Continued)

(52) U.S. Cl.
CPC ...... *H01L 29/1095* (2013.01); *H01L 29/0619* (2013.01); *H01L 29/4236* (2013.01);
(Continued)

(58) Field of Classification Search
CPC ............ H01L 29/1095; H01L 29/0619; H01L 29/4236; H01L 29/7813
See application file for complete search history.

(56) References Cited

U.S. PATENT DOCUMENTS

2006/0102908 A1* 5/2006 Imai ...................... H01L 29/086
257/77
2012/0052642 A1* 3/2012 Endo ................. H01L 21/30604
438/270

(Continued)

FOREIGN PATENT DOCUMENTS

JP    2015-118966    6/2015

*Primary Examiner* — Christine Enad
(74) *Attorney, Agent, or Firm* — Oblon, McClelland, Maier & Neustadt, L.L.P.

(57) ABSTRACT

A switching device includes a semiconductor substrate; first and second trenches; gate insulating layers; and gate electrodes. The semiconductor substrate includes a first semiconductor region of a first conductivity type, a body region of a second conductivity type, a second semiconductor region of the first conductivity type, first and second bottom semiconductor regions of the second conductivity type disposed in areas extending to bottom surfaces of the first and second trenches, and a connection semiconductor region of the second conductivity type extending from the first trench to reach the second trench in a depth range from a depth of a lower end of the body region to a depth of the bottom surfaces of the first and second trenches, the connection semiconductor region contacting the second semiconductor region, and being connected to the body region, and the first and second bottom semiconductor regions.

15 Claims, 11 Drawing Sheets

(51) Int. Cl.
*H01L 29/423* (2006.01)
*H01L 29/78* (2006.01)
*H01L 29/66* (2006.01)

(52) U.S. Cl.
CPC .. *H01L 29/42368* (2013.01); *H01L 29/66583* (2013.01); *H01L 29/66734* (2013.01); *H01L 29/7813* (2013.01)

(56) References Cited

U.S. PATENT DOCUMENTS

2015/0171175 A1    6/2015  Takaya et al.
2017/0110571 A1*  4/2017  Kobayashi .......... H01L 29/7813
2017/0373185 A1* 12/2017  Yilmaz ............... H01L 29/4236

* cited by examiner

SWITCHING DEVICE AND METHOD OF MANUFACTURING THE SAME

INCORPORATION BY REFERENCE

The disclosure of Japanese Patent Application No. 2016-180714 filed on Sep. 15, 2016 including the specification, drawings and abstract is incorporated herein by reference in its entirety.

BACKGROUND

1. Technical Field

The technique disclosed in this specification relates to a switching device and a method of manufacturing the same.

2. Description of Related Art

Japanese Patent Application Publication No. 2015-118966 (JP 2015-118966 A) discloses a switching device including a gate electrode disposed in a trench. The switching device includes an n-type first semiconductor region (source region), a p-type body region, and an n-type second semiconductor region (drift region). The first semiconductor region, the body region, and the second semiconductor region are in contact with a gate insulating layer at a side surface of the trench. Further, the switching device includes a p-type bottom semiconductor region that is in contact with a bottom surface of the trench. The switching device further includes a p-type connection semiconductor region extending along a part of the side surface of the trench. The connection semiconductor region is connected to the body region and the bottom semiconductor region. By the connection semiconductor region, the potential of the bottom semiconductor region is controlled to be substantially equal to that of the body region. When the switching device is turned off, a depletion layer extends from the bottom semiconductor region into the second semiconductor region. By the depletion layer, electric field concentration in the vicinity of the bottom semiconductor region (i.e., in the vicinity of the bottom of the trench) is suppressed.

SUMMARY

In the switching device, a p-n junction at an interface between the body region and the second semiconductor region can be used as a p-n diode. In the switching device of JP 2015-118966 A, the connection semiconductor region is connected to the body region and is in contact with the second semiconductor region. Therefore, an interface between the connection semiconductor region and the second semiconductor region can also operate as a p-n diode. The p-n diode is connected in parallel to the switching device. When a reverse voltage is applied to the switching device, current flows through the p-n diode. The p-n diode can be used as a so-called reflux diode.

In order to reduce loss when current flows through a p-n diode, it is preferable that the forward voltage drop of the p-n diode be small. Therefore, this specification proposes a technique that further reduces the forward voltage drop of a p-n diode included in a switching device.

A switching device disclosed in this specification includes: a semiconductor substrate; a first trench provided in an upper surface of the semiconductor substrate; a second trench provided in the upper surface of the semiconductor substrate and disposed at an interval from the first trench; gate insulating layers each of which covers an inner surface of a corresponding one of the first and second trenches; and gate electrodes each of which is disposed in a corresponding one of the first and second trenches and is insulated from the semiconductor substrate by a corresponding one of the gate insulating layers. The semiconductor substrate includes a first semiconductor region, a body region, a second semiconductor region, a first bottom semiconductor region, a second bottom semiconductor region, and a connection semiconductor region. The first semiconductor region is a region of a first conductivity type disposed between the first and second trenches and facing the gate electrodes in the first and second trenches via the gate insulating layers. The body region is a region of a second conductivity type contacting the first semiconductor region from a lower side and facing the gate electrodes in the first and second trenches via the gate insulating layers. The second semiconductor region is a region of the first conductivity type contacting the body region from the lower side, the second semiconductor region being separated from the first semiconductor region by the body region, and the second semiconductor region facing the gate electrodes in the first and second trenches via the gate insulating layers. The first bottom semiconductor region is a region of the second conductivity type disposed in an area extending to a bottom surface of the first trench, the first bottom semiconductor region contacting the second semiconductor region. The second bottom semiconductor region is a region of the second conductivity type disposed in an area extending to a bottom surface of the second trench, the second bottom semiconductor region contacting the second semiconductor region. The connection semiconductor region is a region of the second conductivity type provided at a part of an area under the body region, the connection semiconductor region extending from the first trench to reach the second trench in a depth range from a depth of a lower end of the body region to a depth of the bottom surfaces of the first and second trenches, the connection semiconductor region contacting the second semiconductor region, and the connection semiconductor region being connected to the body region, the first bottom semiconductor region, and the second bottom semiconductor region.

One of the first conductivity type and the second conductivity type is an n-type and the other is a p-type. In the first semiconductor region, a portion facing the gate electrode in the first trench via the gate insulating layer and a portion facing the gate electrode in the second trench via the gate insulating layer may be continuous with each other or separated from each other.

In this switching device, since the first bottom semiconductor region and the second bottom semiconductor region are connected to the body region via the connection semiconductor region, electric field concentration in the vicinity of the bottom semiconductor regions (i.e., in the vicinity of the bottoms of the trenches) is suppressed.

In this switching device, the connection semiconductor region extends from the first trench to reach the second trench in the depth range from the depth of the lower end of the body region to the depth of the bottom surfaces of the first and second trenches. Since the connection semiconductor region extends in this way, as compared to a case where a connection semiconductor region is disposed only in the vicinity of the trench, the area of an interface between the connection semiconductor region and the second semiconductor region (i.e., a p-n junction) is increased. Therefore, the current path of a p-n diode included in the switching device is increased in size (i.e., the current path is widened), and thus, the forward voltage drop of the p-n diode is made smaller. With the switching device, the forward voltage drop of the included p-n diode can be reduced as compared to the related art. Therefore, it is possible to reduce loss that is caused in the p-n diode.

Further, this specification provides a method of manufacturing a switching device. The method includes preparing a semiconductor substrate including a second semiconductor region of a first conductivity type and a body region of a second conductivity type, the body region contacting the second semiconductor region from an upper side and being exposed at an upper surface of the semiconductor substrate; forming a connection semiconductor region of the second conductivity type by implanting a second conductivity type impurity into the upper surface of the semiconductor substrate via a mask, the connection semiconductor region protruding downward from the body region; forming a first trench and a second trench in the upper surface of the semiconductor substrate, the first and second trenches extending through the body region to reach the second semiconductor region and extending to cross the connection semiconductor region when viewed from the upper surface of the semiconductor substrate; forming a first bottom semiconductor region of the second conductivity type by implanting the second conductivity type impurity at a bottom surface of the first trench, the first bottom semiconductor region being connected to the connection semiconductor region, and forming a second bottom semiconductor region of the second conductivity type by implanting the second conductivity type impurity at a bottom surface of the second trench, the second bottom semiconductor region being connected to the connection semiconductor region; and completing the switching device using the semiconductor substrate. The switching device includes gate insulating layers each of which covers an inner surface of a corresponding one of the first and second trenches, gate electrodes each of which is disposed in a corresponding one of the first and second trenches and is insulated from the semiconductor substrate by a corresponding one of the gate insulating layers, and a first semiconductor region of the first conductivity type disposed between the first and second trenches, the first semiconductor region contacting the body region from the upper side, the first semiconductor region being separated from the second semiconductor region by the body region, and the first semiconductor region facing the gate electrodes in the first and second trenches via the gate insulating layers.

A part of the process of completing the switching device using the semiconductor substrate (e.g., a process of forming the semiconductor region such as the first semiconductor region) may be carried out at any timing, for example, a timing before the first and second trenches are formed.

According to this manufacturing method, it is possible to form the connection semiconductor region extending from the first trench to reach the second trench. Therefore, according to this manufacturing method, it is possible to manufacture the switching device in which the forward voltage drop of the included p-n diode is small.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
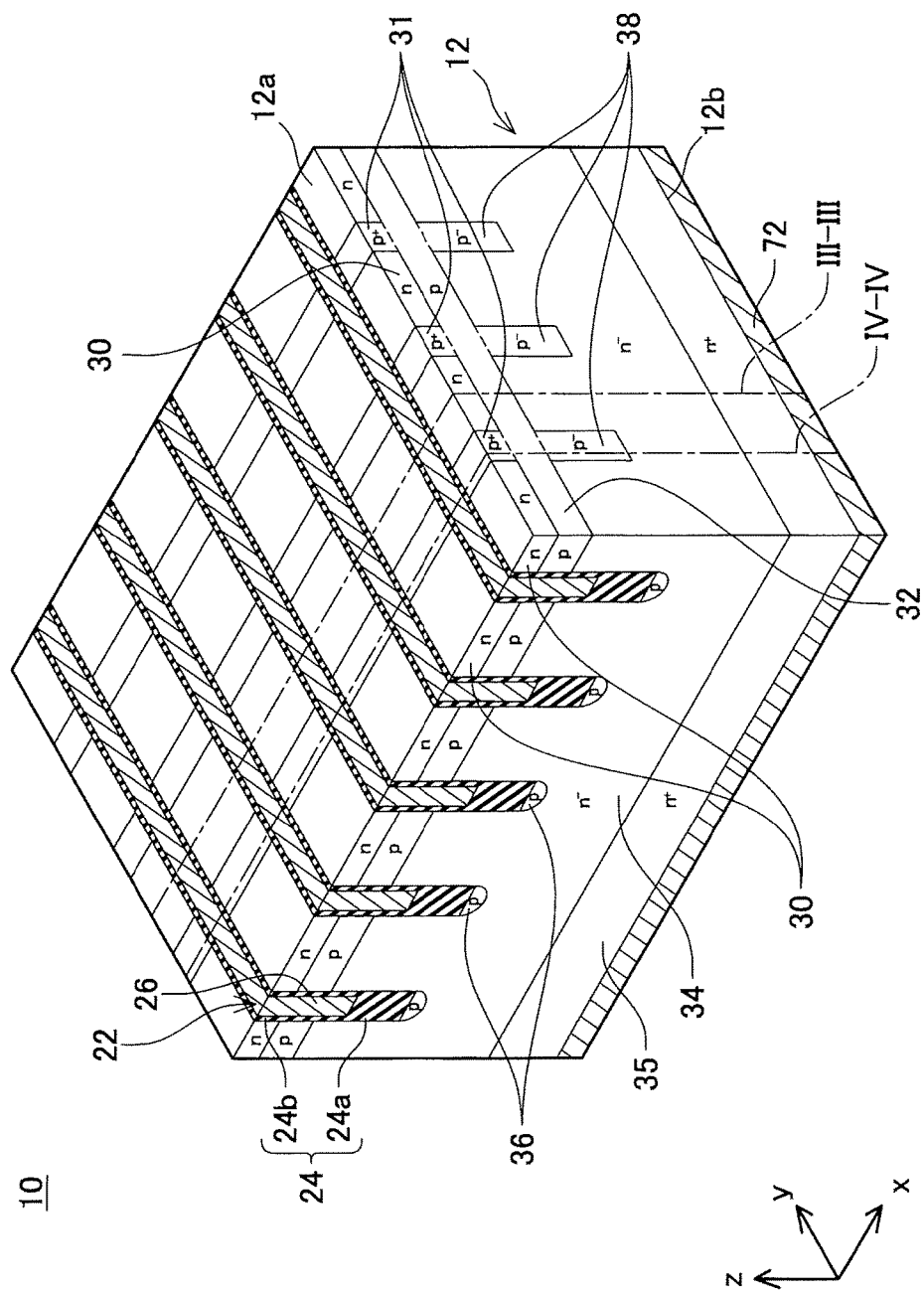
FIG. 1 is a perspective view showing a top surface and sections of a MOSFET.
Figure 2:
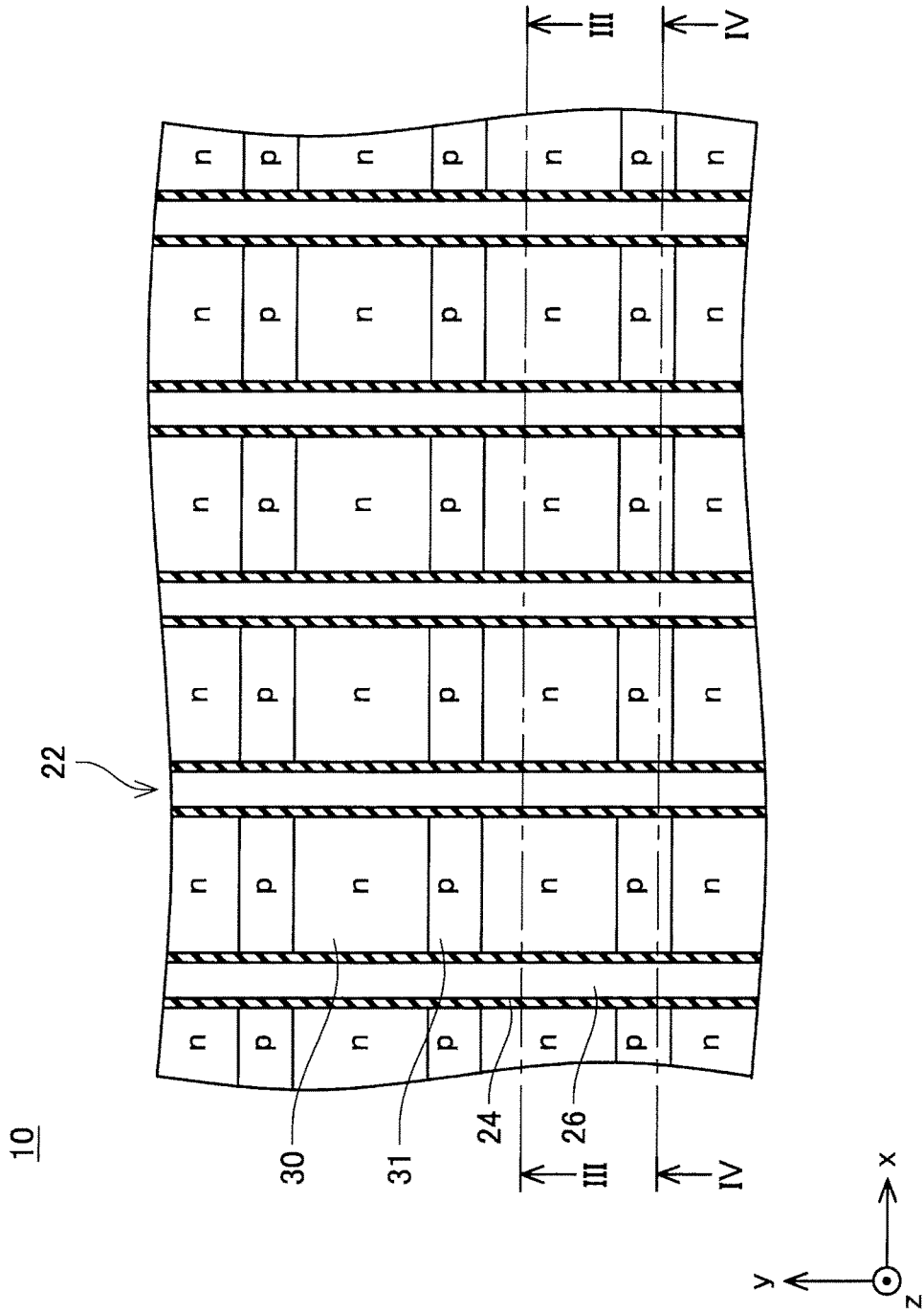
FIG. 2 is a plan view of the MOSFET.
Figure 3:
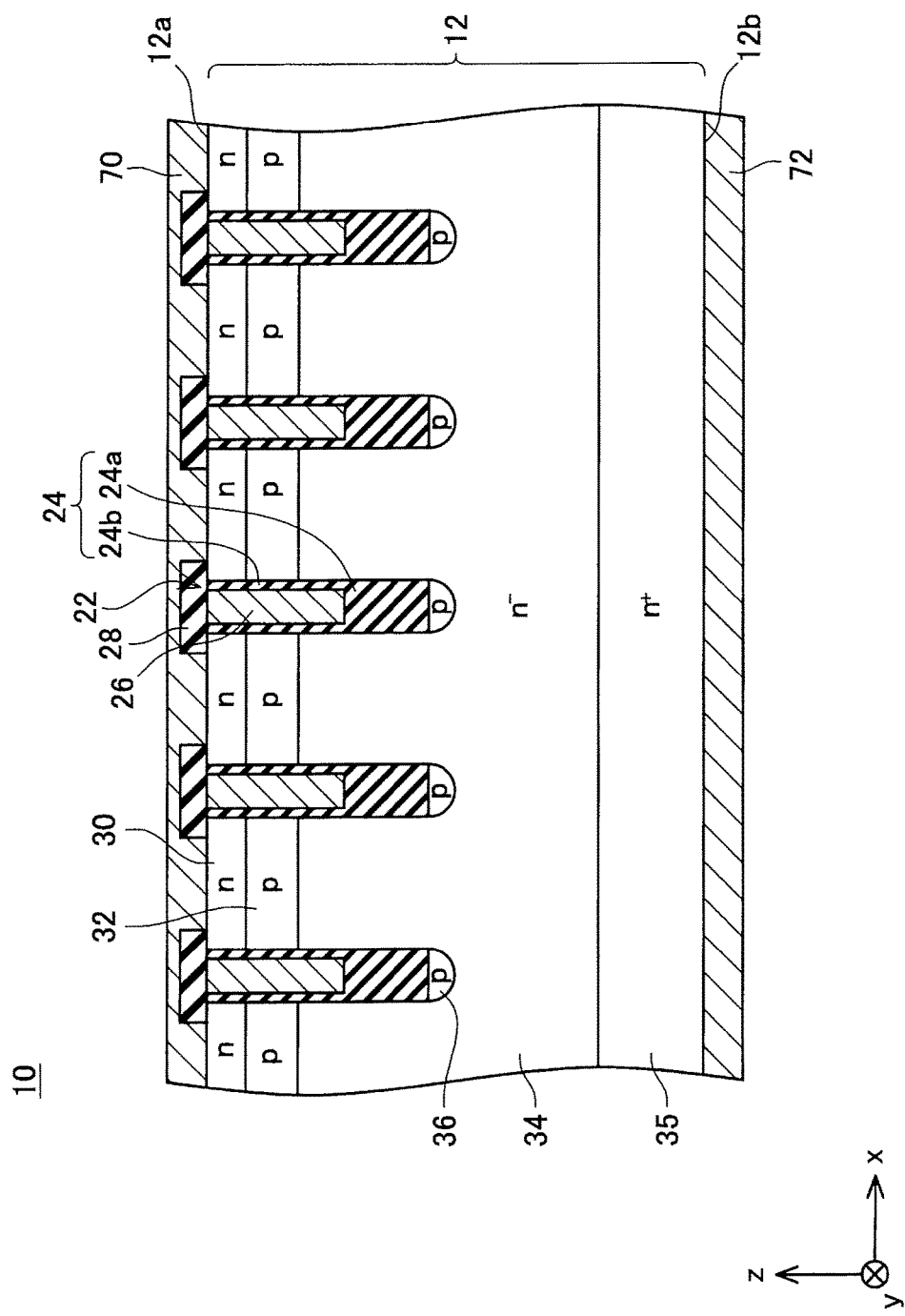
FIG. 3 is a sectional view taken along line of FIGS. 1 and 2.
Figure 4:
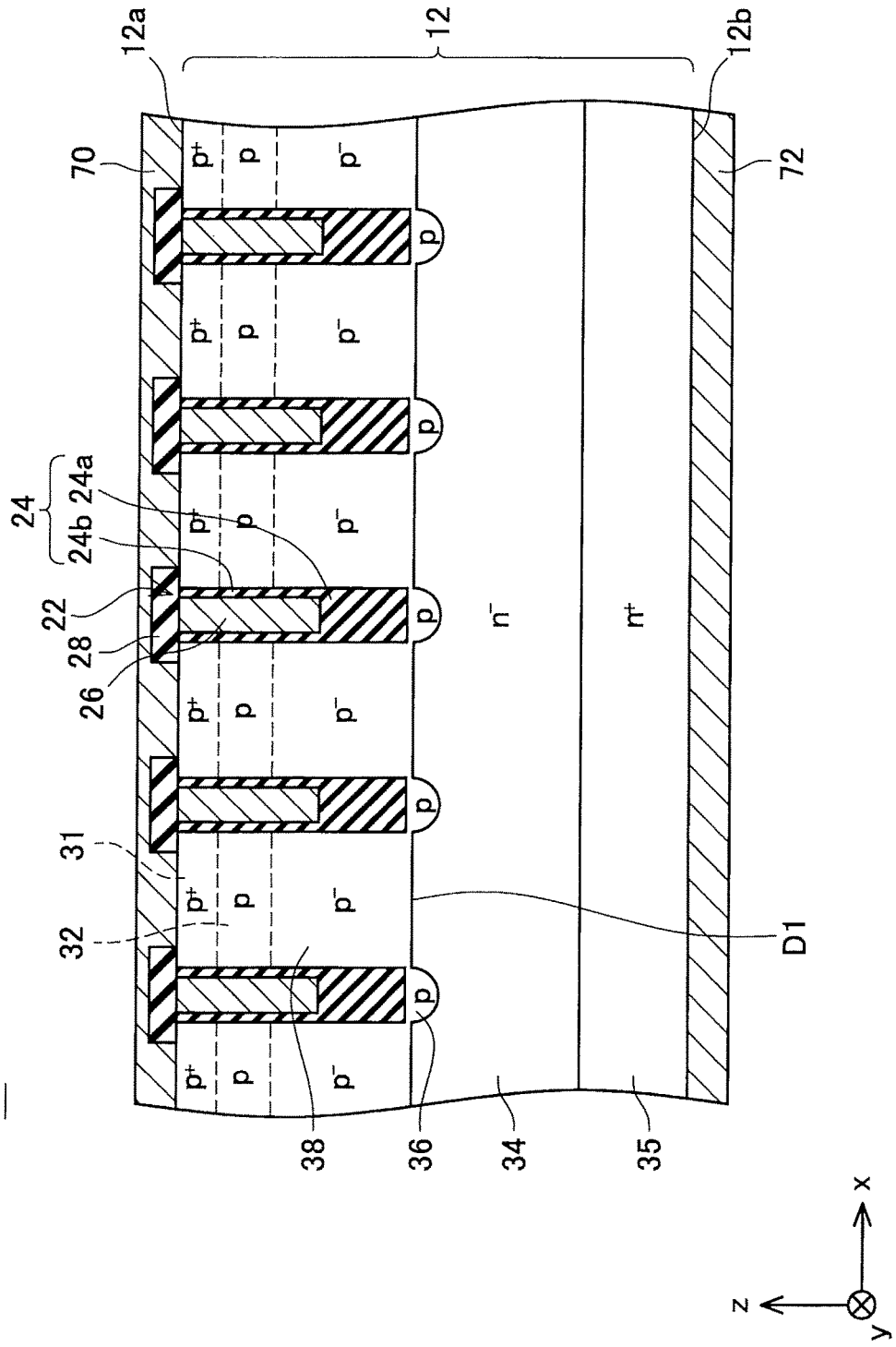
FIG. 4 is a sectional view taken along line IV-IV of FIGS. 1 and 2.

FIGS. 1 to 4 show a metal-oxide-semiconductor field-effect transistor (MOSFET) 10 according to an embodiment. As shown in FIGS. 3 and 4, the MOSFET 10 includes a semiconductor substrate 12, electrodes, insulating layers, and so on. In FIGS. 1 and 2, illustration of the electrode and the insulating layer on an upper surface 12a of the semiconductor substrate 12 is omitted for better visibility. Hereinbelow, one direction parallel to the upper surface 12a of the semiconductor substrate 12 will be referred to as an x-direction, a direction parallel to the upper surface 12a and orthogonal to the x-direction will be referred to as a y-direction, and a thickness direction of the semiconductor substrate 12 will be referred to as a z-direction.

The semiconductor substrate 12 is made of SiC. As shown in FIGS. 1 to 4, a plurality of trenches 22 is provided in the upper surface 12a of the semiconductor substrate 12. In the upper surface 12a, each trench 22 extends long and straight in the y-direction. The trenches 22 are disposed at intervals in the x-direction. A gate insulating layer 24 and a gate electrode 26 are disposed in each trench 22.

The gate insulating layer 24 covers an inner surface of the trench 22. The gate insulating layer 24 is made of silicon oxide. The gate insulating layer 24 includes a bottom insulating layer 24a and side insulating films 24b. The bottom insulating layer 24a is disposed at the bottom of the trench 22. The bottom insulating layer 24a covers a bottom surface of the trench 22. Further, the bottom insulating layer 24a covers side surfaces of the trench 22 in the vicinity of the bottom surface of the trench 22. The side insulating films 24b respectively cover the side surfaces of the trench 22 located above the bottom insulating layer 24a.

The gate electrode 26 is disposed on an upper portion of the bottom insulating layer 24a. That is, an insulating layer between the gate electrode 26 and the bottom surface of the trench 22 is the bottom insulating layer 24a, while an insulating layer between the gate electrode 26 and each side surface of the trench 22 is the side insulating film 24b. The gate electrode 26 is insulated from the semiconductor substrate 12 by the side insulating films 24b and the bottom insulating layer 24a. An upper surface of each gate electrode 26 is covered with an interlayer insulating film 28.

The thickness of the side insulating film 24b (i.e., the interval between the side surface of the trench 22 and a side surface of the gate electrode 26) is smaller than the thickness of the bottom insulating layer 24a (i.e., the width between an upper surface and a lower surface of the bottom insulating layer 24a (i.e., the interval between a lower end of the gate electrode 26 and the bottom surface of the trench 22)).

As shown in FIGS. 3 and 4, an upper electrode 70 is disposed on the upper surface 12a of the semiconductor substrate 12. The upper electrode 70 covers the interlayer insulating films 28. The upper electrode 70 is in contact with the upper surface 12a of the semiconductor substrate 12 at portions where the interlayer insulating film 28 is not provided. The upper electrode 70 is insulated from the gate electrodes 26 by the interlayer insulating films 28. A lower electrode 72 is disposed on a lower surface 12b of the semiconductor substrate 12. The lower electrode 72 is in contact with the lower surface 12b of the semiconductor substrate 12.

As shown in FIGS. 1 to 4, a plurality of source regions 30, a plurality of body contact regions 31, a body region 32, a drift region 34, a drain region 35, a plurality of bottom semiconductor regions 36, and a plurality of connection semiconductor regions 38 are provided in the semiconductor substrate 12.

Each of the source regions 30 is an n-type region. The source region 30 is disposed between the adjacent two trenches 22. The source region 30 is disposed in an area extending to the upper surface 12a of the semiconductor substrate 12 and is in ohmic contact with the upper electrode 70. The source region 30 is in contact with the side insulating films 24b at upper end portions of the trenches 22. The source region 30 faces the gate electrodes 26 in the trenches 22 on its both sides via the side insulating film 24b.

Each of the body contact regions 31 is disposed at the lateral side of the source region 30. The body contact region 31 is disposed in an area extending to the upper surface 12a of the semiconductor substrate 12 and is in ohmic contact with the upper electrode 70. The body contact region 31 extends long in a direction crossing the trenches 22 (i.e., in the x-direction). The body contact region 31 is in contact with the side insulating films 24b at upper end portions of the trenches 22.

The body region 32 is a p-type region. The body region 32 is disposed under the source regions 30 and the body contact regions 31. The body region 32 is in contact with the source regions 30 and the body contact regions 31 from the lower side. The p-type impurity concentration of the body region 32 is lower than that of the body contact region 31. The body region 32 is in contact with the side insulating films 24b, under the source regions 30 and the body contact regions 31. The body region 32 faces the gate electrodes 26 in the trenches 22 via the side insulating film 24b. A lower end of the body region 32 is located higher than the lower end of the gate electrode 26 (i.e., the upper surface of the bottom insulating layer 24a).

The drift region 34 is an n-type region. The drift region 34 is disposed under the body region 32 and separated from the source regions 30 by the body region 32. The drift region 34 is in contact with the body region 32 from the lower side. The drift region 34 is in contact with the side insulating films 24b and the bottom insulating layers 24a, under the body region 32. The drift region 34 faces the gate electrodes 26 in the trenches 22 via the side insulating films 24b.

The drain region 35 is an n-type region. The drain region 35 has a higher n-type impurity concentration than that of the drift region 34. The drain region 35 is disposed under the drift region 34. The drain region 35 is in contact with the drift region 34 from the lower side. The drain region 35 is provided in an area extending to the lower surface 12b of the semiconductor substrate 12 and is in ohmic contact with the lower electrode 72.

Each of the bottom semiconductor regions 36 is a p-type region. The bottom semiconductor region 36 is disposed in an area extending to the bottom surface of the corresponding trench 22. The bottom semiconductor region 36 is disposed at the bottom surface of the corresponding trench 22 and is in contact with the bottom insulating layer 24a. The bottom semiconductor region 36 extends long in the y-direction along the bottom surface of the corresponding trench 22. The bottom semiconductor region 36 covers the entire bottom surface of the corresponding trench 22. The bottom semiconductor region 36 is surrounded by the drift region 34. The bottom semiconductor region 36 is in contact with the drift region 34.

As shown in FIG. 1, each of the connection semiconductor regions 38 is a p-type region protruding downward (to the drift region 34 side) from the body region 32. The connection semiconductor region 38 is disposed below the corresponding body contact region 31. The connection semiconductor region 38 extends long in a direction crossing the trenches 22 (i.e., in the x-direction) along the corresponding body contact region 31. Therefore, as shown in FIG. 4, in an area between the adjacent two trenches 22, the connection semiconductor region 38 extends from one of the trenches 22 to reach the other trench 22. As shown in FIG. 1, the connection semiconductor regions 38 are disposed at intervals in the y-direction. As shown in FIG. 4, the connection semiconductor region 38 extends from the lower end of the body region 32 to a depth D1 deeper than the lower end of the trench 22. The connection semiconductor region 38 extends in the x-direction in the entire depth range from the lower end of the body region 32 to the depth D1. The connection semiconductor region 38 is in contact with the bottom semiconductor regions 36. The connection semiconductor region 38 is in contact with the drift region 34 at its bottom surface and side surfaces. The p-type impurity concentration of the connection semiconductor region 38 is lower than that of the body contact region 31 and that of the body region 32.

As described above, the plurality of body contact regions 31, the body region 32, the plurality of connection semiconductor regions 38, and the plurality of bottom semiconductor regions 36 are the p-type regions that are connected to each other. In this specification, the p-type region distributed in the horizontal directions (x-direction and y-direction) along the upper surface 12a of the semiconductor substrate 12 is the body region 32. The p-type regions each protruding upward from the body region 32 to reach the upper surface 12a are the body contact regions 31. The p-type regions each located just under (immediately under) the bottom surface of the trench 22 are the bottom semiconductor regions 36. The p-type regions each protruding downward from the body region 32 so as to be continuous with the bottom semiconductor regions 36 are the connection semiconductor regions 38.

Next, the operation of the MOSFET 10 will be described. When the MOSFET 10 is used, the MOSFET 10, a load (e.g., a motor), and a power supply are connected in series. A power supply voltage (about 800V in this embodiment) is applied to a series circuit of the MOSFET 10 and the load. The power supply voltage is applied in a direction such that the drain side (the lower electrode 72) becomes higher in potential than the source side (the upper electrode 70) in the MOSFET 10. When a gate-on potential (a potential higher than a gate threshold) is applied to the gate electrodes 26, channels (inversion layers) are formed in the body region 32 at areas contacting the side insulating films 24b, so that the MOSFET 10 is turned on. When a gate-off potential (a potential lower than or equal to the gate threshold) is applied to the gate electrodes 26, the channels disappear so that the MOSFET 10 is turned off. Hereinbelow, operations of the MOSFET 10 when it is turned off and turned on will be described in detail.

When the MOSFET 10 is turned off, the potential of the gate electrodes 26 is reduced from the gate-on potential to the gate-off potential. Then, the channels disappear, and the potential of the lower electrode 72 increases. The potential of the lower electrode 72 increases to a potential that is higher than that of the upper electrode 70 by the power supply voltage (i.e., about 800V). The bottom semiconductor regions 36 are connected to the upper electrode 70 via the connection semiconductor regions 38, the body region 32, and the body contact regions 31. Therefore, in the period during which the potential of the lower electrode 72 increases, the potential of the bottom semiconductor regions 36 is fixed at a potential substantially equal to that of the upper electrode 70 (i.e., at a potential close to 0V). With the increase in the potential of the lower electrode 72, the potentials of the drain region 35 and the drift region 34 also increase. When the potential of the drift region 34 is increased, a potential difference occurs between the body region 32 and the drift region 34. Therefore, a reverse voltage is applied to a p-n junction at an interface between the body region 32 and the drift region 34. Accordingly, a depletion layer extends from the body region 32 into the drift region 34. In addition, when the potential of the drift region 34 is increased, a potential difference occurs between the bottom semiconductor regions 36 and the drift region 34. Therefore, a reverse voltage is applied to a p-n junction at an interface between each of the bottom semiconductor regions 36 and the drift region 34. Accordingly, a depletion layer extends from each of the bottom semiconductor regions 36 into the drift region 34. By the depletion layers extending into the drift region 34 in this way, electric field concentration in the drift region 34 is suppressed. In particular, by the depletion layers extending from the bottom semiconductor regions 36, electric field concentration in the vicinity of the bottom surfaces of the trenches 22 is suppressed.

If a large number of crystal defects are present in the connection semiconductor regions 38, leakage current flows via the connection semiconductor regions 38 when the MOSFET 10 is off. As will be described later in detail, in this embodiment, since the connection semiconductor regions 38 are formed by high-temperature ion implantation, the number of crystal defects in the connection semiconductor regions 38 is small. Therefore, leakage current hardly flows when the MOSFET 10 is off.

When the MOSFET 10 is turned on, the potential of the gate electrodes 26 is increased from the gate-off potential to the gate-on potential. Then, in the body region 32, electrons are attracted to areas contacting the side insulating films 24b. Accordingly, the areas in the body region 32 are inverted from p-type to n-type, so that channels are formed. By these channels, the source regions 30 and the drift region 34 are connected to each other. As a result, the potentials of the drift region 34, the drain region 35, and the lower electrode 72 are reduced. When the potential of the drift region 34 is reduced, the reverse voltage applied to the p-n junction at the interface between the body region 32 and the drift region 34 is reduced. Therefore, the depletion layer extending from the body region 32 into the drift region 34 contracts toward the body region 32. In addition, when the potential of the drift region 34 is reduced, the reverse voltage applied to the p-n junction at the interface between each of the bottom semiconductor regions 36 and the drift region 34 is reduced. Therefore, the depletion layer extending from each of the bottom semiconductor regions 36 into the drift region 34 contracts toward the corresponding bottom semiconductor region 36. By the contraction of the depletion layers extending into the drift region 34 in this way, the resistance of the drift region 34 is reduced. Therefore, electrons flow from the upper electrode 70 into the lower electrode 72 via the source regions 30, the channels, the drift region 34, and the drain region 35. That is, the MOSFET 10 is turned on.

In the MOSFET 10, a p-n diode is formed by a p-type region including the body contact regions 31, the body region 32, the connection semiconductor regions 38, and the bottom semiconductor regions 36, and an n-type region including the drift region 34 and the drain region 35. There is a case where the potential of the upper electrode 70 becomes higher than that of the lower electrode 72 due to an operation of an external circuit. In this case, current flows through the p-n diode. As the area of a p-n junction at an interface between the p-type region and the n-type region becomes larger, the forward voltage drop of the p-n diode becomes smaller. If there were no connection semiconductor region 38, only an interface between the body region 32 and the drift region 34 would function as the p-n junction of the p-n diode. In contrast, in this embodiment, the connection semiconductor region 38 protruding downward from the body region 32 is provided. Therefore, the bottom surface and side surfaces of the connection semiconductor region 38 also function as the p-n junction of the p-n diode. Accordingly, in this embodiment, the area of the p-n junction is large, and thus, the forward voltage drop of the p-n diode is small. Further, in this embodiment, the p-type impurity concentration of the connection semiconductor region 38 is lower than that of the body contact region 31 and that of the body region 32. Thus, since the p-type impurity concentration of a p-type region forming the p-n junction (i.e., the connection semiconductor region 38) is made low, the forward voltage drop of the p-n diode can be made further smaller. Since the forward voltage drop of the p-n diode is small in this way, loss that is caused when current flows through the p-n diode is small.

Even in the case where a connection semiconductor region (a p-type region connecting a bottom semiconductor region and a body region) is provided only in the vicinity of a gate insulating layer as described in JP 2015-118966 A, an interface between the connection semiconductor region and a drift region functions as a p-n junction of a p-n diode. However, in this case, as compared to the case of this embodiment (i.e., the case where the connection semiconductor region extends from one of the trenches to the other trench), the area of the p-n junction at the interface between the connection semiconductor region and the drift region is small. According to the configuration of this embodiment, as compared to the configuration of JP 2015-118966 A, the area of the p-n junction of the p-n diode can be made further larger, and thus, the forward voltage drop of the p-n diode can be made further smaller.

Next, referring to FIGS. 5 to 11, a method of manufacturing the MOSFET 10 will be described. FIGS. 5 to 11 show sections of a semiconductor substrate in the manufacturing process for the MOSFET 10. In FIGS. 5 to 11, a section on the right side is a section of a portion where the connection semiconductor region 38 is not provided (part of a section corresponding to FIG. 3), while a section on the left side is a section of a portion where the connection semiconductor region 38 is provided (part of a section corresponding to FIG. 4).

Figure 5:
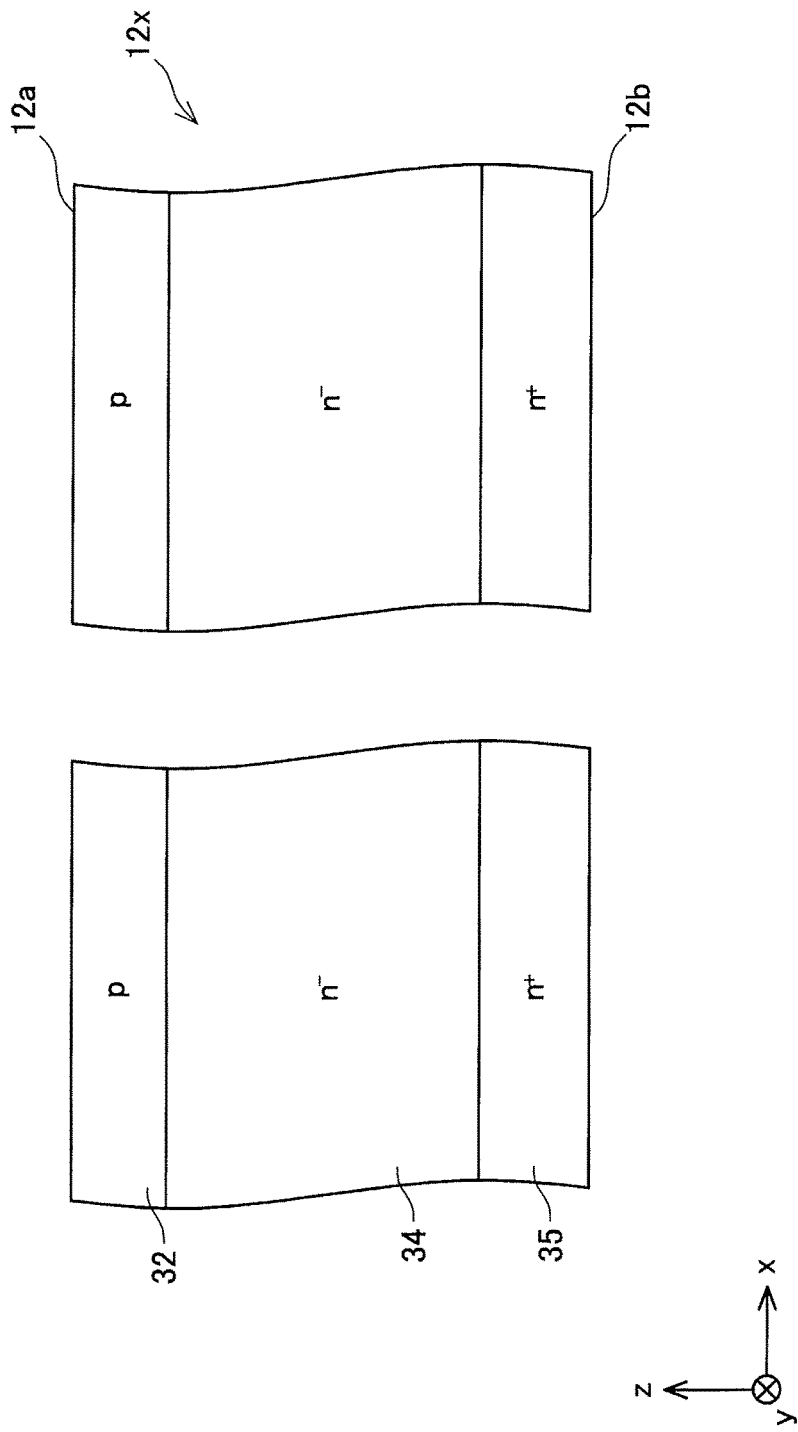
FIG. 5 is a sectional view of a semiconductor substrate before processing.

First, as shown in FIG. 5, a semiconductor substrate 12x (a semiconductor substrate as a material of the MOSFET 10) including the drain region 35, the drift region 34, and the body region 32 is prepared. The semiconductor substrate 12x is made of SiC. The drift region 34 is a region formed on the drain region 35 by epitaxial growth. The body region 32 is a region formed on the drift region 34 by epitaxial growth or ion implantation.

Figure 6:
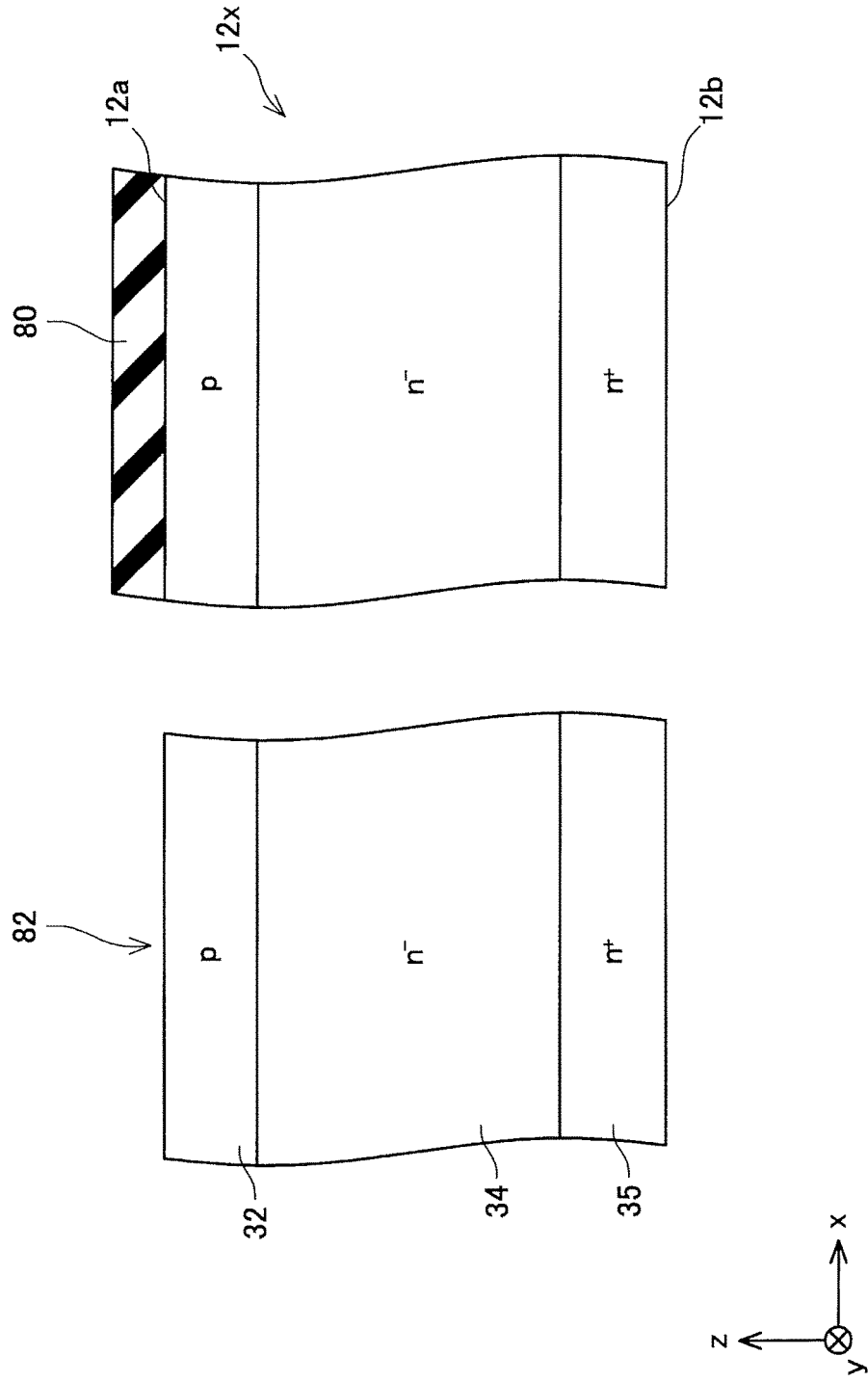
FIG. 6 is a sectional view of the semiconductor substrate after a mask is formed.

Then, as shown in FIG. 6, a mask 80 is formed on an upper surface 12a of the semiconductor substrate 12x. The mask 80 is made of a material (e.g., silicon oxide) having a high heat resistance. Then, by patterning the mask 80, openings 82 are formed through the mask 80. The openings 82 are provided above portions where the connection semiconductor regions 38 are to be formed.

Figure 7:
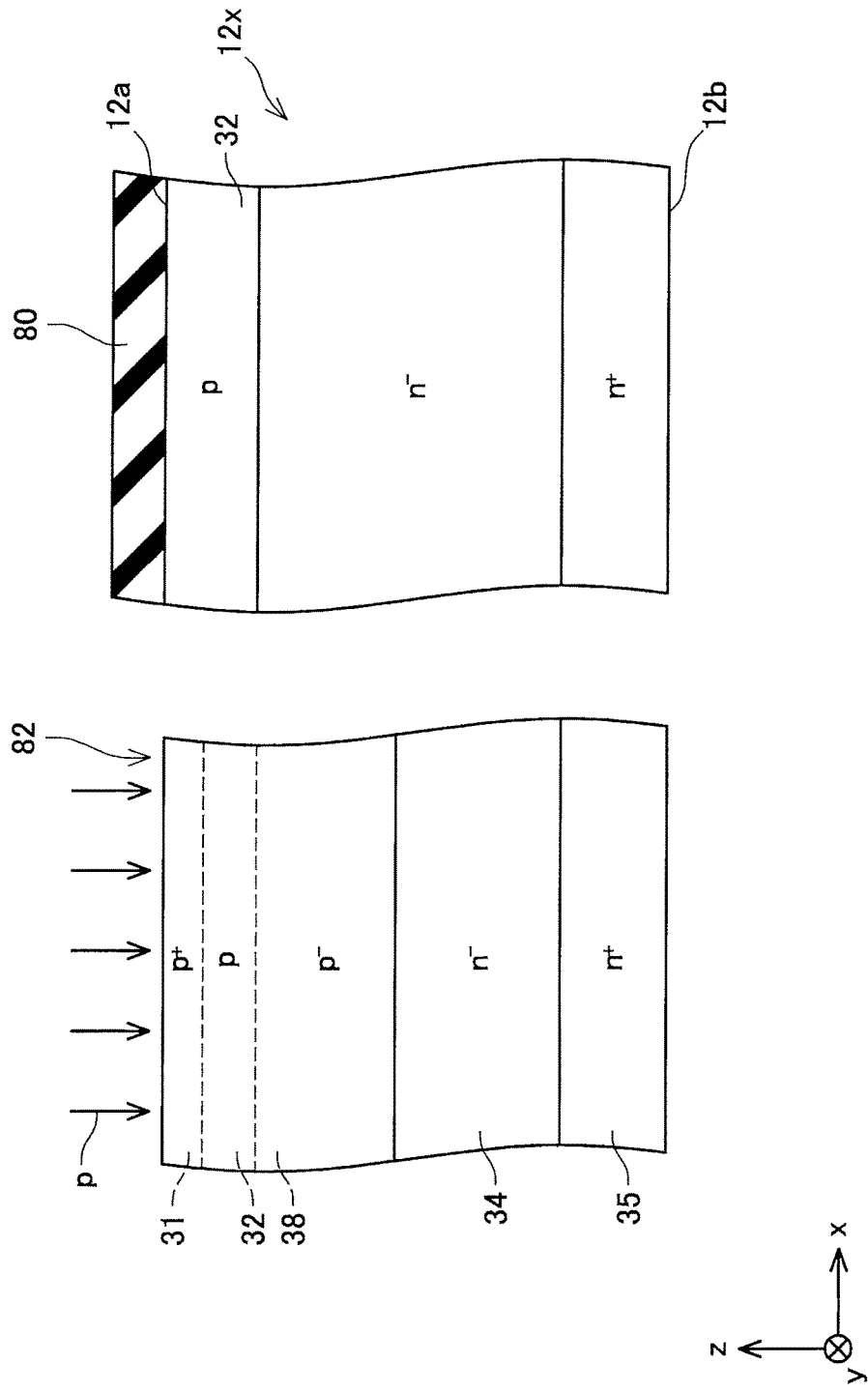
FIG. 7 is a sectional view of the semiconductor substrate after p-type impurities are implanted.

Then, as shown in FIG. 7, the p-type impurities are emitted toward the upper surface 12a of the semiconductor substrate 12x via the mask 80. Herein, the p-type impurities are emitted in a state where the semiconductor substrate 12x is heated at approximately 150° C. (so-called high-temperature ion implantation is performed). Through the openings 82, the p-type impurities are implanted into the semiconductor substrate 12x. In an area covered with the mask 80, implantation of the p-type impurities into the semiconductor substrate 12x is prevented by the mask 80. Herein, the p-type impurities are emitted a plurality of times while the emitting energy (irradiation energy) is changed, thereby implanting the p-type impurities in a wide range from a shallow position to a relatively deep position. Consequently, as shown in FIG. 7, the body contact regions 31 and the connection semiconductor regions 38 are formed. The body contact regions 31 are formed so as to be exposed at the upper surface 12a of the semiconductor substrate 12x. In the shallow range, the body contact regions 31 with a high p-type impurity concentration are formed by implanting the p-type impurities at a high concentration, while, in the deep range, the connection semiconductor regions 38 with a low p-type impurity concentration are formed by implanting the p-type impurities at a low concentration. Since the connection semiconductor regions 38 and the body contact regions 31 are formed by the high-temperature ion implantation, crystal defects hardly occur in these regions. Therefore, the connection semiconductor regions 38 and the body contact regions 31 with a low crystal defect density can be formed.

Figure 8:
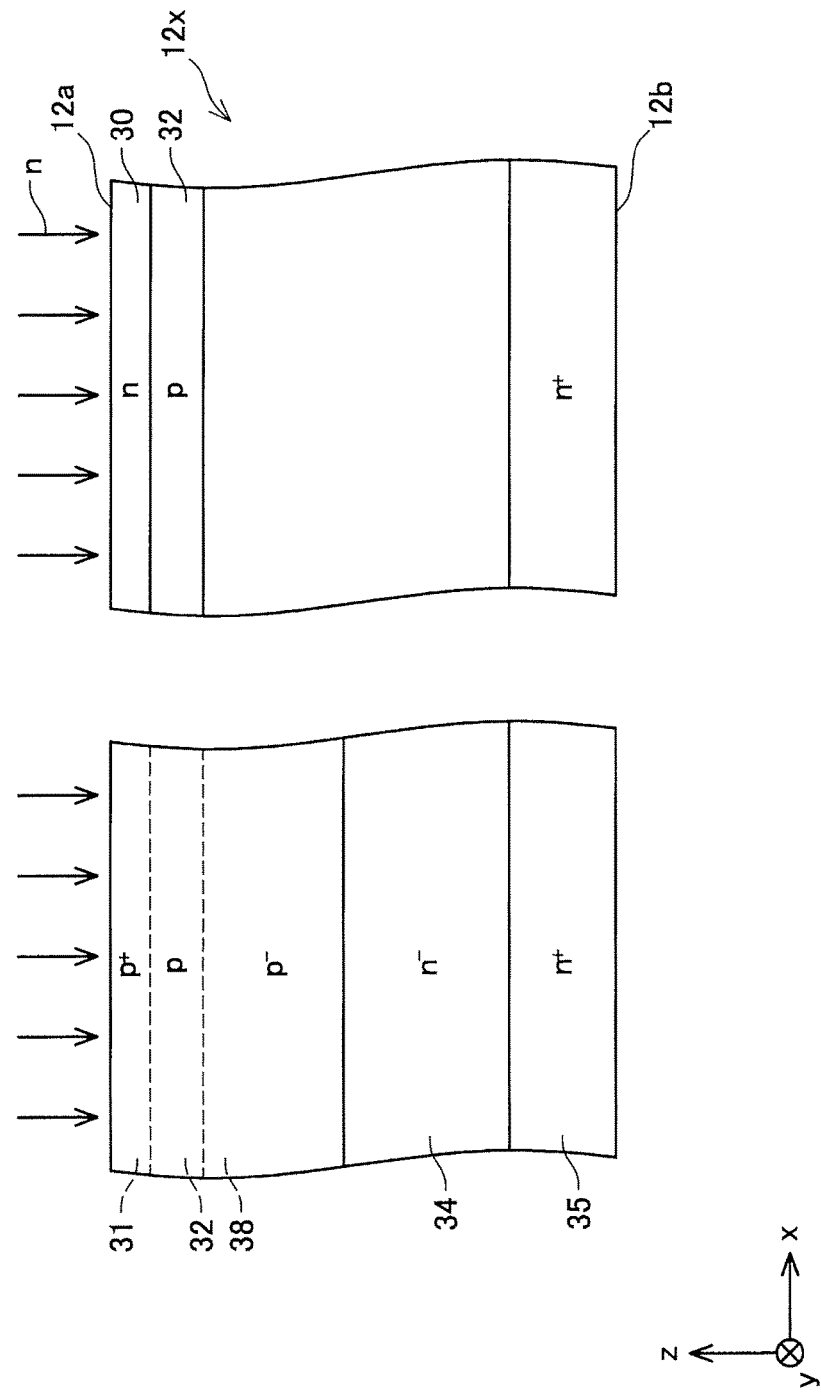
FIG. 8 is a sectional view of the semiconductor substrate after n-type impurities are implanted.

Then, as shown in FIG. 8, the source regions 30 are formed by implanting the n-type impurities into the upper surface 12a of the semiconductor substrate 12x. Although the n-type impurities are implanted also into the body contact regions 31, since the p-type impurity concentration of the body contact region 31 is high, the source region 30 is not formed in the body contact region 31. The n-type impurity implantation for forming the source regions 30 may be carried out prior to the p-type impurity implantation for forming the connection semiconductor regions 38 and the body contact regions 31 (FIG. 7).

Figure 9:
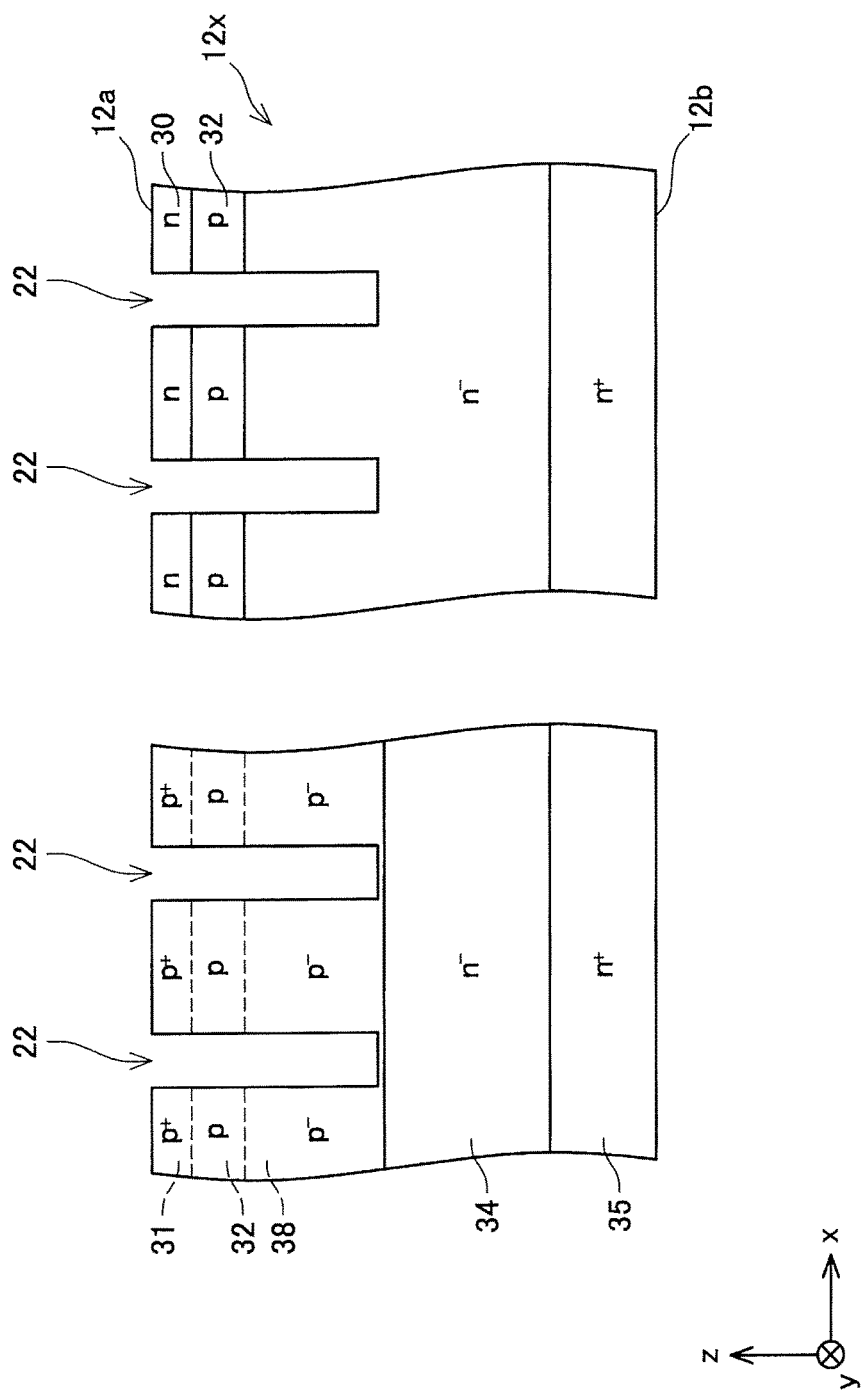
FIG. 9 is a sectional view of the semiconductor substrate after trenches are formed.

Then, as shown in FIG. 9, the trenches 22 are formed by selectively etching the upper surface 12a of the semiconductor substrate 12x. Herein, the trenches 22 are each formed to extend through the body region 32. The trenches 22 are formed such that each trench 22 crosses the connection semiconductor regions 38 and the body contact regions 31, when viewed from the upper surface 12a of the semiconductor substrate 12X. In an area having no connection semiconductor region 38, the lower end of the trench 22 is located in the drift region 34, while, in an area having the connection semiconductor region 38, the lower end of the trench 22 is located in the connection semiconductor region 38 (more specifically, in the vicinity of the lower end of the connection semiconductor region 38).

Figure 10:
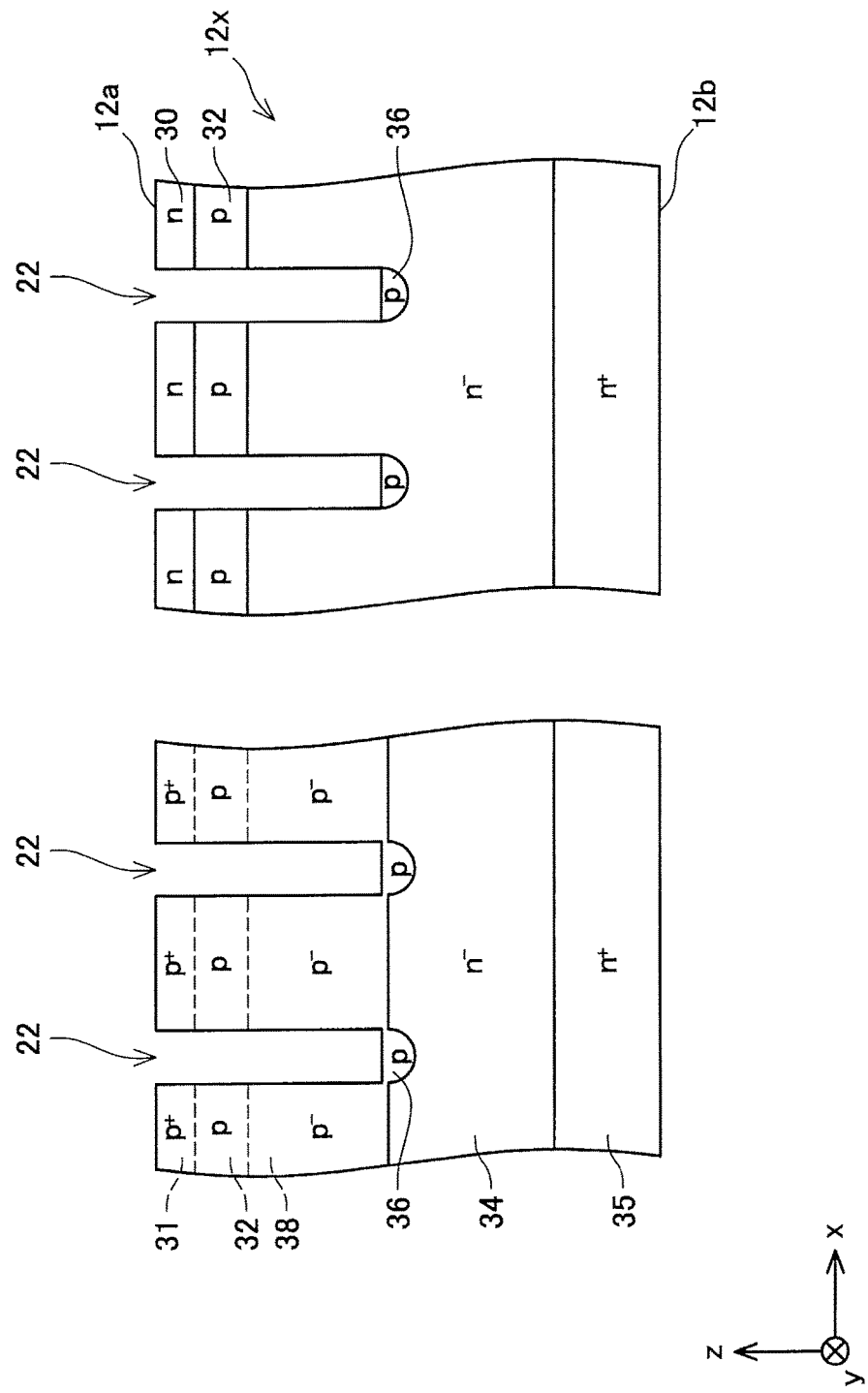
FIG. 10 is a sectional view of the semiconductor substrate after bottom semiconductor regions are formed.

Then, as shown in FIG. 10, the bottom semiconductor regions 36 are formed by implanting the p-type impurities at the bottom surfaces of the trenches 22. The bottom semiconductor regions 36 are connected to the connection semiconductor regions 38.

Figure 11:
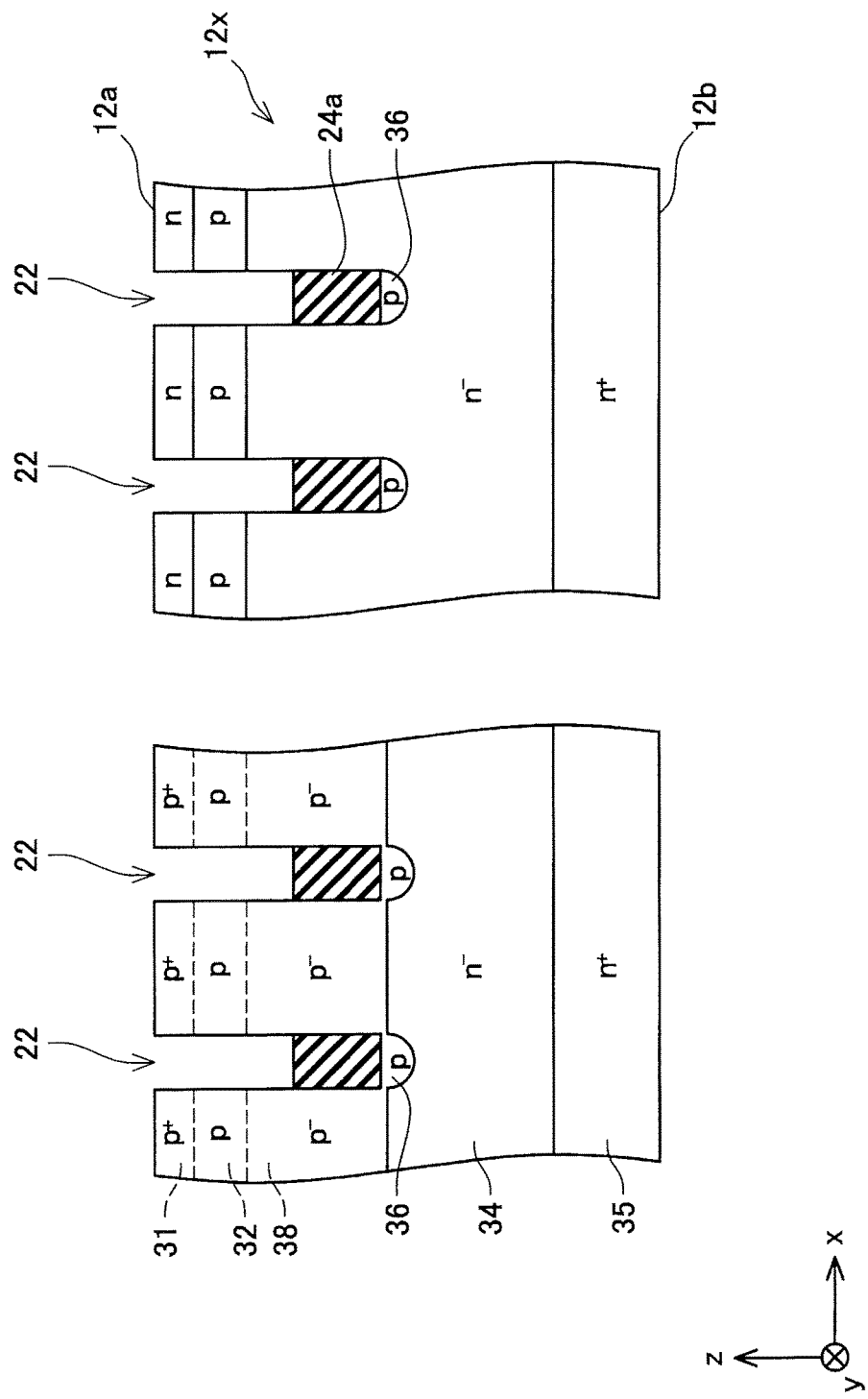
FIG. 11 is a sectional view of the semiconductor substrate after bottom insulating layers are formed.

Then, silicon oxide is embedded in the trenches 22 by low pressure chemical vapor deposition (LP-CVD) or the like, and thereafter, the silicon oxide is etched. Consequently, as shown in FIG. 11, the bottom insulating layers 24a are formed. Thereafter, the side insulating films 24b, the gate electrodes 26, the interlayer insulating films 28, the upper electrode 70, the lower electrode 72, and so on are formed by conventional well-known methods, and thus, the MOSFET 10 shown in FIGS. 1 to 4 is completed.

According to this method, since the connection semiconductor region 38 can be formed by the high-temperature ion implantation, the crystal defect density in the connection semiconductor region 38 can be made small. In the case where a connection semiconductor region (a p-type region connecting a bottom semiconductor region and a body region) is provided only in the vicinity of a gate insulating layer as described in JP 2015-118966 A, the connection semiconductor region can be formed by emitting the p-type impurities in a direction inclined with respect to a semiconductor substrate so as to implant the p-type impurities at a side surface of a trench. In this case, since the p-type impurities need to be implanted only at a part of the side surface of the trench, it is necessary to form a mask that is patterned at the side surface of the trench. Since the width of the trench is extremely small, it is necessary to use an organic material (e.g., a photoresist) as the mask in order to pattern the mask at the side surface of the trench. Since the heat resistance of the organic material is low, the ion implantation at the side surface of the trench cannot be carried out at a high temperature. Therefore, the ion implantation needs to be carried out at a relatively low temperature (e.g., room temperature). In the room-temperature ion implantation, a large number of crystal defects are caused in the connection semiconductor region. Accordingly, leakage current tends to flow via the connection semiconductor region when a MOSFET is off. In contrast, in the manufacturing method of this embodiment, since the connection semiconductor region 38 is formed by the ion implantation into the upper surface 12a of the semiconductor substrate 12x, it is possible to use the mask 80 made of the inorganic material having the high heat resistance. Therefore, the connection semiconductor region 38 can be formed by the high-temperature ion implantation, and thus, the number of crystal defects formed in the connection semiconductor region 38 is small. Consequently, according to this method, it is possible to manufacture the MOSFET 10 in which leakage current hardly occurs.

According to this manufacturing method, the connection semiconductor region 38 and the body contact region 31 can be formed by the ion implantation using the same mask 80. Therefore, the MOSFET 10 can be efficiently manufactured.

While the connection semiconductor region 38 is formed by the high-temperature ion implantation in the above-described manufacturing method, the connection semiconductor region 38 may be formed by embedded epitaxial growth in another manufacturing method.

In the above embodiment, the p-type impurity concentration of the connection semiconductor region 38 is lower than that of the body contact region 31. However, the p-type impurity concentration of the connection semiconductor region 38 may be substantially equal to that of the body contact region 31. In this case, the p-type impurity concentration of the connection semiconductor region 38 can be set to $1\times10^{19}$ atoms/cm$^3$ or more. With this configuration, it is possible to prevent occurrence of a situation where the entire connection semiconductor region 38 is depleted when the MOSFET 10 is off. Therefore, when the MOSFET 10 is off, equipotential lines tend to extend horizontally from a lower portion of the trench 22 into a lower portion of the connection semiconductor region 38, and thus, electric field concentration is suppressed. Accordingly, the breakdown voltage of the MOSFET 10 is further improved.

The width of the connection semiconductor region 38 in the short-side direction (y-direction) can be set to 1.0 μm or more. With this configuration, it is possible to prevent occurrence of a situation where the entire connection semiconductor region 38 is depleted when the MOSFET 10 is off. Therefore, when the MOSFET 10 is off, equipotential lines tend to extend horizontally from a lower portion of the trench 22 into a lower portion of the connection semiconductor region 38, and thus, electric field concentration is suppressed. Accordingly, the breakdown voltage of the MOSFET 10 is further improved.

While the n-channel MOSFET has been described in the above embodiment, the technique disclosed in this specification may be applied also to a p-channel MOSFET. The p-channel MOSFET can be formed by replacing the n-type regions in the above embodiment with the p-type regions and replacing the p-type regions in the above embodiment with the n-type regions.

The source region 30 in the embodiment is an example of a "first semiconductor region" according to the disclosure. The drift region 34 in the embodiment is an example of a "second semiconductor region" according to the disclosure.

Technical elements disclosed in this specification are listed below. The following technical elements are useful independently of each other.

The switching device disclosed in this specification by way of example includes a plurality of connection semiconductor regions. The connection semiconductor regions are disposed at an interval in a longitudinal direction of a first trench and a second trench.

With this configuration, the potential of bottom semiconductor regions is more stabilized. Further, since the area of the p-n junction of the p-n diode included in the switching device is increased, the forward voltage drop of the p-n diode is made further smaller.

The switching device disclosed in this specification by way of example further includes the upper electrode disposed on the upper surface of the semiconductor substrate. The semiconductor substrate further includes the body contact region. The body contact region is a region of a second conductivity type that is disposed above the connection semiconductor region, that is in contact with the upper electrode, and that is connected to the body region.

With this configuration, the body region can be connected to the upper electrode via the body contact region. Further, since the body contact region is disposed above the connection semiconductor region, when the switching device is manufactured, the body contact region can be formed by carrying out impurity implantation using the same mask as the mask for forming the connection semiconductor region (that is, using the mask used in forming the connection semiconductor region). The connection semiconductor region and the body contact region can be efficiently formed.

In the configuration disclosed in this specification by way of example, the second conductivity type impurity concentration of the connection semiconductor region is lower than that of the body contact region.

With this configuration, the forward voltage drop of the p-n diode included in the switching device can be made still smaller.

The manufacturing method disclosed in this specification by way of example includes forming the body contact region of the second conductivity type by implanting the second conductivity type impurity into the upper surface of the semiconductor substrate via the same mask as the mask for forming the connection semiconductor region (i.e., via the mask used in forming the connection semiconductor region), the body contact region being disposed above the connection semiconductor region, exposed at the upper surface of the semiconductor substrate, and connected to the body region; and forming the upper electrode on the upper surface of the semiconductor substrate, the upper electrode contacting the body contact region.

With this configuration, the body contact region can be formed by carrying out the impurity implantation using the same mask as the mask for forming the connection semiconductor region. The connection semiconductor region and the body contact region can be efficiently formed.

While specific examples of the disclosure have been described in detail, these are for illustrative purposes only and thus do not limit the scope of the disclosure. Various modifications and changes may be made to the specific examples described above without departing from the scope of the disclosure. The technical elements described in this specification or in the drawings exhibit technical utility alone or in various combinations and are not limited to the combinations recited in the specific examples described above. The technique described in this specification or in the drawings achieves a plurality of objects simultaneously and has technical utility by achieving any one of the objects.

What is claimed is:
1. A switching device comprising:
a semiconductor substrate;
a first trench provided in an upper surface of the semiconductor substrate;
a second trench provided in the upper surface of the semiconductor substrate and disposed at an interval from the first trench;
gate insulating layers each of which covers an inner surface of a corresponding one of the first and second trenches; and
gate electrodes each of which is disposed in a corresponding one of the first and second trenches and is insulated from the semiconductor substrate by a corresponding one of the gate insulating layers,
wherein the semiconductor substrate includes
a first semiconductor region of a first conductivity type disposed between the first and second trenches and facing the gate electrodes in the first and second trenches via the gate insulating layers,
a body region of a second conductivity type contacting the first semiconductor region from a lower side and facing the gate electrodes in the first and second trenches via the gate insulating layers,
a second semiconductor region of the first conductivity type contacting the body region from the lower side, the second semiconductor region being separated from the first semiconductor region by the body region, and the second semiconductor region facing the gate electrodes in the first and second trenches via the gate insulating layers, a first bottom semiconductor region of the second conductivity type disposed in an area extending to a bottom surface of the first trench, the first bottom semiconductor region contacting the second semiconductor region,
a second bottom semiconductor region of the second conductivity type disposed in an area extending to a bottom surface of the second trench, the second bottom semiconductor region contacting the second semiconductor region, and
a connection semiconductor region of the second conductivity type provided at a part of an area under the body region, the connection semiconductor region including a portion extending from the first trench to reach the second trench in a depth range from a depth of a lower end of the body region to a depth of the bottom surfaces of the first and second trenches, the portion of the connection semiconductor region contacting the second semiconductor region, and the portion of the connection semiconductor region being connected to the body region, the first bottom semiconductor region, and the second bottom semiconductor region,
wherein the first and second trenches extend to cross the connection semiconductor region when viewed from the upper surface of the semiconductor substrate.

2. The switching device according to claim 1, wherein the semiconductor substrate includes a plurality of the connection semiconductor regions, and the connection semiconductor regions are disposed at an interval in a longitudinal direction of the first and second trenches.

3. The switching device according to claim 1, further comprising an upper electrode disposed on the upper surface of the semiconductor substrate, wherein the semiconductor substrate further includes a body contact region of the second conductivity type, the body contact region being disposed above the connection semiconductor region and the body region, the body contact region contacting the upper electrode, and the body contact region being connected to the body region.

4. The switching device according to claim 3, wherein a second conductivity type impurity concentration of the connection semiconductor region is lower than that of the body contact region.

5. The switching device according to claim 1, wherein the first and second trenches extend to cross the connection semiconductor region when viewed from the upper surface of the semiconductor substrate such that a second portion of the connection semiconductor region abuts a first side of the first trench, the portion extending from the first trench to reach the second trench abuts a second side first trench opposing the first side of the first trench, the portion extending from the first trench to reach the second trench abuts a first side of the second trench, and a third portion of the connection semiconductor region abuts a second side of the second trench opposing the first side of the second trench.

6. The switching device according to claim 1, wherein the first semiconductor region extends from the first trench to the second trench, and the body region extends from the first trench to the second trench.

7. The switching device according to claim 1, wherein the semiconductor substrate further includes a body contact region of the second conductivity type, the body contact region being disposed above the connection semiconductor region and the body region, the body contact region contacting the upper electrode, and the body contact region being connected to the body region.

8. A method of manufacturing a switching device, comprising:
preparing a semiconductor substrate including a second semiconductor region of a first conductivity type and a body region of a second conductivity type, the body region contacting the second semiconductor region from an upper side and being exposed at an upper surface of the semiconductor substrate;
forming a connection semiconductor region of the second conductivity type by implanting a second conductivity type impurity into the upper surface of the semiconductor substrate via a mask, the connection semiconductor region protruding downward from the body region;
forming a first trench and a second trench in the upper surface of the semiconductor substrate, the first and second trenches extending through the body region to reach the second semiconductor region and extending to cross the connection semiconductor region when viewed from the upper surface of the semiconductor substrate;
forming a first bottom semiconductor region of the second conductivity type by implanting the second conductivity type impurity at a bottom surface of the first trench, the first bottom semiconductor region being connected to the connection semiconductor region, and forming a second bottom semiconductor region of the second conductivity type by implanting the second conductivity type impurity at a bottom surface of the second trench, the second bottom semiconductor region being connected to the connection semiconductor region; and
completing the switching device using the semiconductor substrate, wherein the switching device includes gate insulating layers each of which covers an inner surface of a corresponding one of the first and second trenches, gate electrodes each of which is disposed in a corresponding one of the first and second trenches and is insulated from the semiconductor substrate by a corresponding one of the gate insulating layers, and a first semiconductor region of the first conductivity type disposed between the first and second trenches, the first semiconductor region contacting the body region from the upper side, the first semiconductor region being separated from the second semiconductor region by the body region, and the first semiconductor region facing the gate electrodes in the first and second trenches via the gate insulating layers.

9. The method according to claim 8, wherein the connection semiconductor region is formed by implanting the second conductivity type impurity into the upper surface of the semiconductor substrate via the mask in a state where the semiconductor substrate is heated.

10. The method according to claim 8, further comprising:
forming a body contact region of the second conductivity type by implanting the second conductivity type impurity into the upper surface of the semiconductor substrate via the mask that is used in forming the connection semiconductor region, the body contact region being disposed above the connection semiconductor region, the body contact region being exposed at the upper surface of the semiconductor substrate, and the body contact region being connected to the body region and
forming an upper electrode on the upper surface of the semiconductor substrate, the upper electrode contacting the body contact region.

11. The method according to claim 10, wherein the body contact region is formed by implanting the second conductivity type impurity into the upper surface of the semiconductor substrate via the mask in a state where the semiconductor substrate is heated.

12. The method according to claim 8, wherein the first and second trenches extend to cross the connection semiconductor region when viewed from the upper surface of the semiconductor substrate such that a first portion of the connection semiconductor region abuts a first side of the first trench, a second portion the connection semiconductor region extending from the first trench to the second trench abuts a second side first trench opposing the first side of the first trench, the second portion abuts a first side of the second trench, and a third portion of the connection semiconductor region abuts a second side of the second trench opposing the first side of the second trench.

13. The method according to claim 8, wherein the first semiconductor region extends from the first trench to the second trench, and the body region extends from the first trench to the second trench.

14. The method according to claim 8, further comprising forming a body contact region of the second conductivity type by implanting the second conductivity type impurity into the upper surface of the semiconductor substrate via the mask that is used in forming the connection semiconductor region, the body contact region being disposed above the connection semiconductor region, the body contact region being exposed at the upper surface of the semiconductor substrate, and the body contact region being connected to the body region.

15. The method according to claim 8, wherein forming the first trench and the second trench in the upper surface of the semiconductor substrate includes forming the first trench and the second trench in the connection semiconductor region.

* * * * *